(12) United States Patent
Tsai et al.

(10) Patent No.: US 12,469,710 B2
(45) Date of Patent: *Nov. 11, 2025

(54) METHOD OF MANUFACTURING A SEMICONDUCTOR DEVICE

(71) Applicant: Taiwan Semiconductor Manufacturing Company, Ltd., Hsinchu (TW)

(72) Inventors: Chun Hsiung Tsai, Xinpu Township (TW); Yu-Ming Lin, Hsinchu (TW); Kuo-Feng Yu, Zhudong Township (TW); Ming-Hsi Yeh, Hsinchu (TW); Shahaji B. More, Hsinchu (TW); Chandrashekhar Prakash Savant, Hsinchu (TW); Chih-Hsin Ko, Fongshan (TW); Clement Hsingjen Wann, Carmel, NY (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/603,866

(22) Filed: Mar. 13, 2024

(65) Prior Publication Data
US 2024/0258174 A1    Aug. 1, 2024

Related U.S. Application Data

(63) Continuation of application No. 17/865,311, filed on Jul. 14, 2022, now Pat. No. 11,972,982, which is a
(Continued)

(51) Int. Cl.
*H01L 21/3065* (2006.01)
*H01L 21/02* (2006.01)
(Continued)

(52) U.S. Cl.
CPC .... *H01L 21/3065* (2013.01); *H01L 21/02057* (2013.01); *H01L 21/30604* (2013.01);
(Continued)

(58) Field of Classification Search
CPC ....... H01L 21/823431; H01L 21/02057; H01L 21/30604; H01L 21/3065; H01L 21/324;
(Continued)

(56) References Cited

U.S. PATENT DOCUMENTS 9,799,570 B1    10/2017  Cheng
10,026,829 B2    7/2018  Cappellani et al.
(Continued)

FOREIGN PATENT DOCUMENTS

CN    106505040 A    3/2017
CN    106558544 B    11/2019
(Continued)

OTHER PUBLICATIONS

Henry H. Radamson et al., "The Challenges of Advanced CMOS Process from 2D to 3D," Applied Sciences, 7 (10), 1047, 32 pages (2017); <https://doi.org/10.3390/app7101047>.
(Continued)

*Primary Examiner* — Duy Vu N Deo
(74) *Attorney, Agent, or Firm* — STUDEBAKER BRACKETT PLLC

(57) ABSTRACT

In a method of manufacturing a semiconductor device, a fin structure is formed by patterning a semiconductor layer, and an annealing operation is performed on the fin structure. In the patterning of the semiconductor layer, a damaged area is formed on a sidewall of the fin structure, and the annealing operation eliminates the damaged area.

20 Claims, 23 Drawing Sheets

Related U.S. Application Data continuation of application No. 17/168,047, filed on Feb. 4, 2021, now Pat. No. 11,404,322.

(60) Provisional application No. 63/022,411, filed on May 8, 2020.

(51) Int. Cl.
| | |
|---|---|
| *H01L 21/306* | (2006.01) |
| *H01L 21/324* | (2006.01) |
| *H10D 84/01* | (2025.01) |
| *H10D 84/03* | (2025.01) |

(52) U.S. Cl.
CPC ....... *H01L 21/324* (2013.01); *H10D 84/0158* (2025.01); *H10D 84/038* (2025.01)

(58) Field of Classification Search
CPC ....... H01L 21/823821; H01L 21/30608; H01L 21/823807
USPC .......................................... 438/704
See application file for complete search history.

(56) References Cited

U.S. PATENT DOCUMENTS

| | | | |
|---|---|---|---|
| 10,453,684 B1 | 10/2019 | Zhang et al. | |
| 11,404,322 B2 * | 8/2022 | Tsai | H01L 21/02057 |
| 11,972,982 B2 * | 4/2024 | Tsai | H01L 21/02057 |
| 2006/0141706 A1 | 6/2006 | Hong | |
| 2013/0320455 A1 | 12/2013 | Cappellani et al. | |
| 2014/0335679 A1 | 11/2014 | Liu et al. | |
| 2016/0293734 A1 | 10/2016 | Tang et al. | |
| 2017/0250183 A1 | 8/2017 | Brunco | |
| 2018/0019326 A1 | 1/2018 | Lu et al. | |
| 2018/0096898 A1 | 4/2018 | Yu et al. | |
| 2020/0105929 A1 * | 4/2020 | Zhang | H10D 64/017 |

FOREIGN PATENT DOCUMENTS

| | | | | |
|---|---|---|---|---|
| CN | 110957355 A | | 4/2020 | |
| DE | 102019104629 A1 * | | 4/2020 | ....... H01L 21/02164 |
| KR | 10-2006-0075735 A | | 7/2006 | |
| TW | 201342486 A | | 10/2013 | |
| TW | 201637081 A | | 10/2016 | |
| TW | 201703117 A | | 1/2017 | |

OTHER PUBLICATIONS

Shichi Kuboi et al., "Investigation of plasma-induced damage in silicon trench etching," 2016 International Symposium on Semiconductor Manufacturing (ISSM), Tokyo, 2016, pp. 1-4, doi: 10.1109/ISSM.2016.7934531.

N.H. Nickel, "Hydrogen-mediated creation and annihilation of strain in amorphous silicon," Phsical Review B, vol. 51, Iss. 8, pp. 4872-4881, (Feb. 15, 1995); DOI: https://doi.org/10.1103/PhysRevB.51.4872.

Naoto Horiguchi et al., "Junction Strategies for 1x nm Technology Node with FINFET and High Mobility Channel," 2012 12th International Workshop on Junction Technology, Shanghai, 2012, pp. 216-221, doi: 10.1109/IWJT.2012.6212844.

I. Haller et al., "Selective Wet and Dry Etching of Hydrogenated Amorphous Silicon and Related Materials," J. Electrochem. Soc., vol. 135, No. 8, pp. 2042-2045 (Aug. 1988).

R.G. Frieser et al., "Silicon Damage Caused by Hydrogen Containing Plasmas," J. Electrochem. Soc., vol. 130, No. 11, pp. 2237-2241 (Nov. 1983).

Benedicte Demaurex et al., "Low-temperature plasma-deposited silicon epitaxial films: growth and properties," J. of Applied Physics, vol. 116, Issue 5, 8 pages (2014); <https://doi.org/10.1063/1.4892095>.

Yunpeng Yin and Herbert H. Sawin, "Surface roughening of silicon, thermal silicon dioxide, and low-k dielectric coral films in argon plasma," J. Vac. Sci. Technol. A, vol. 26, Issue 1, pp. 151-160 (2008).

Yunpeng Yin and Herbert H. Sawin, "Angular etching yields of polysilicon and dielectric materials in Cl2/Ar and fluorocarbon plasmas," vol. 26., No. 1, pp. 161-173 (2008).

Yunpeng Yin and Herbert H. Sawin, Impact of etching kinetics on the roughening of thermal SiO2 and low-k dielectric coral films in flurocarbon plasmas, J. Vac. Sci. Technol. A, vol. 25, No. 4, pp. 802-811 (2007).

Yunpeng Yin et al., "Investigation of surface roughening of low-k films during etching using fluorocarbon plasma beams," J. Vac. Sci. Technol. B, vol. 24, No. 5, pp. 2360-2371 (2006).

Non-Final Office Action issued in U.S. Appl. No. 17/865,311, dated Apr. 20, 2023.

Final Office Action issued in U.S. Appl. No. 17/865,311, dated Sep. 15, 2023.

Notice of Allowance issued in U.S. Appl. No. 17/865,311, dated Dec. 13, 2023.

Notice of Allowance issued in U.S. Appl. No. 17/865,311, dated Mar. 7, 2024.

\* cited by examiner

METHOD OF MANUFACTURING A SEMICONDUCTOR DEVICE

RELATED APPLICATIONS

This application is continuation application of U.S. patent application Ser. No. 17/865,311 filed Jul. 14, 2022, now U.S. Pat. No. 11,972,982, which is a continuation application of U.S. patent application Ser. No. 17/168,047 filed Feb. 4, 2021, now U.S. Pat. No. 11,404,322, which claims priority to U.S. Provisional Patent Application No. 63/022,411 filed May 8, 2020, the entire contents of each of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) and a gate-all-around (GAA) FET. As transistor dimensions are continually scaled down to sub 10-15 nm technology nodes, further improvements of the FinFET, for example, a precise critical dimension (CD) control and defect or damage free fin formation processes, are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain. In the following embodiments, materials, configurations, dimensions, processes and/or operations as described with respect to one embodiment (e.g., one or more figures) may be employed in the other embodiments, and detailed description thereof may be omitted.

In a manufacturing operation of a semiconductor device including FinFETs, a fin etching process is one of the key processes. In particular, it is required that fin structures after the fin patterning have no defect or are free from damage caused by ion bombardment during a plasma etching process for patterning the fin structures. In the present disclosure, a novel process for reducing or suppressing damage on the fin structure during plasma dry etching and for eliminating residual damage after the fin patterning process is provided.

Figure 4A:
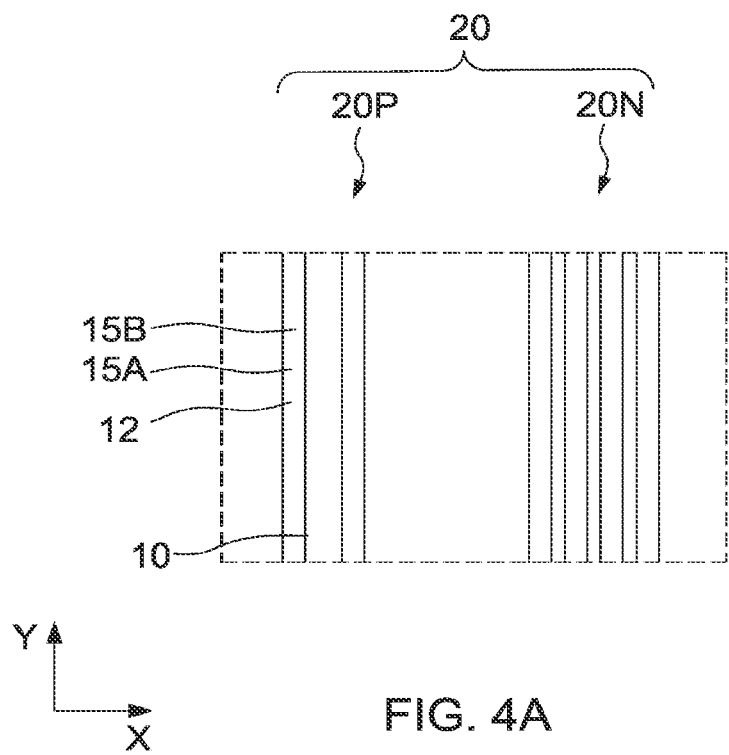
FIGS. 4A, 4B, 4C and 4D show cross sectional views of various stages of a sequential process for manufacturing a FinFET device according to an embodiment of the present disclosure.
Figure 4B:
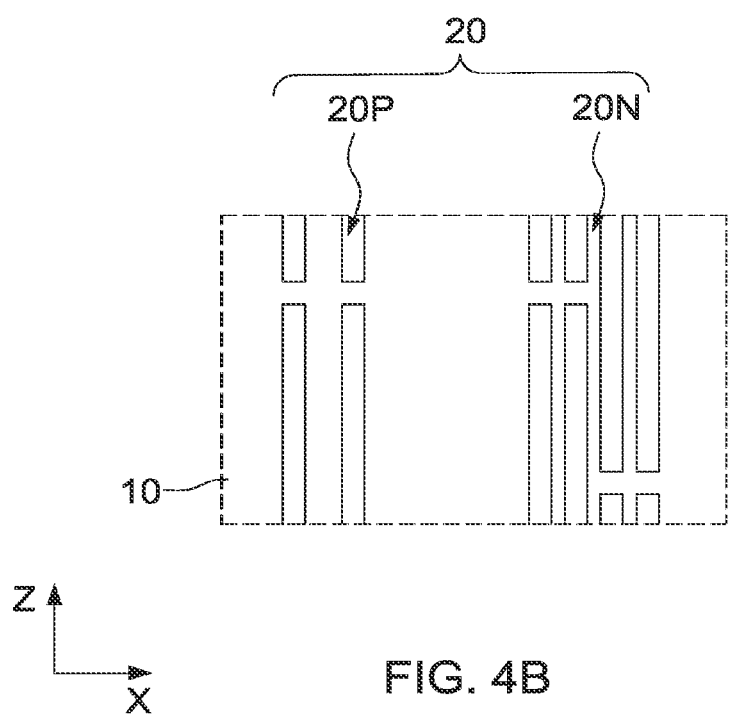
Figure 4C:
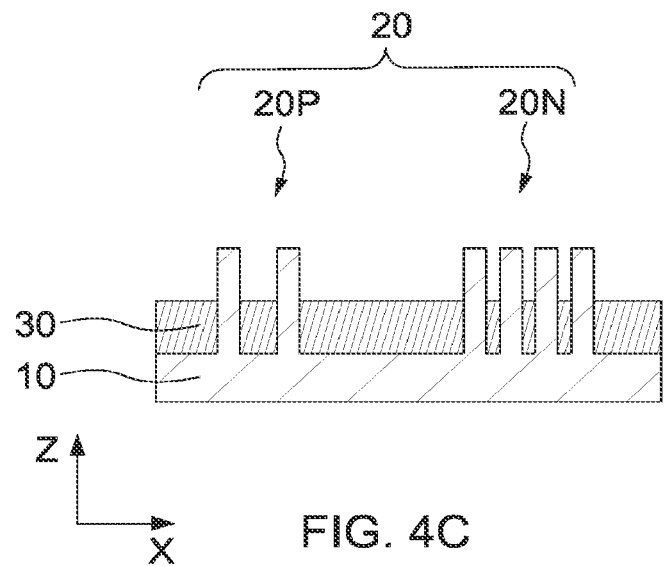
Figure 4D:
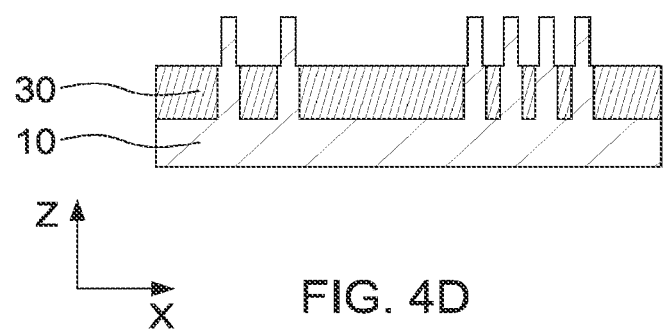
Figure 5A:
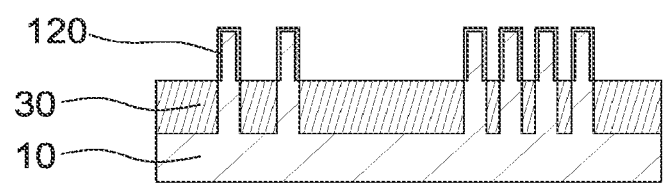
FIGS. 5A, 5B, 5C, 5D, 5E and 5F show cross sectional views of various stages of a sequential process for manufacturing a FinFET device according to an embodiment of the present disclosure.
Figure 5B:
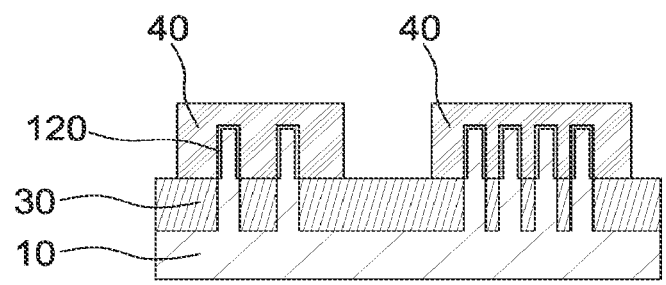
Figure 5C:
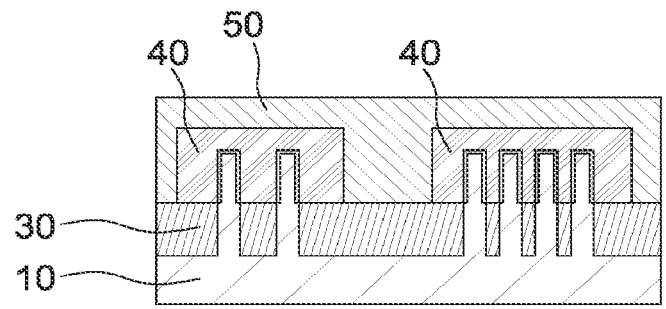
Figure 5D:
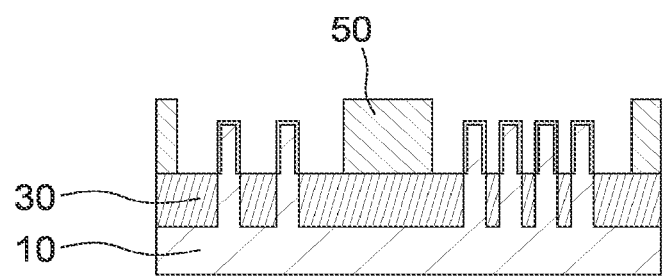
Figure 5E:
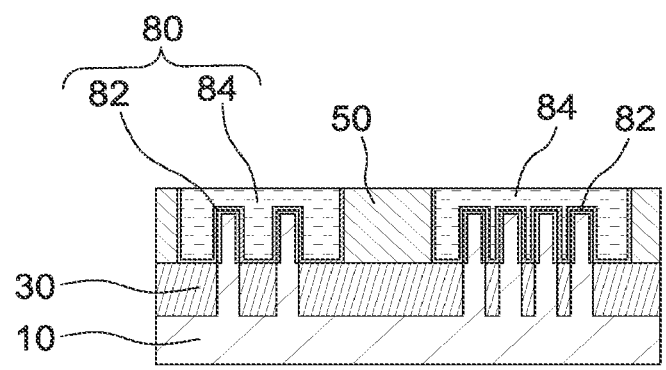
Figure 5F:
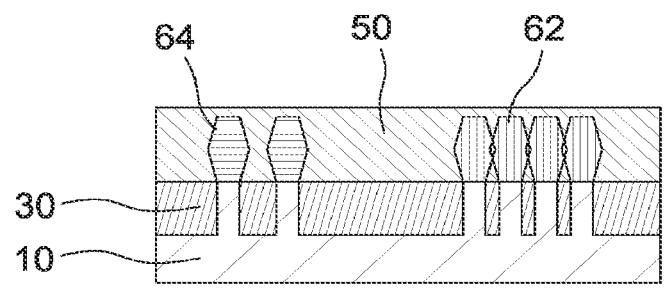
Figure 6:
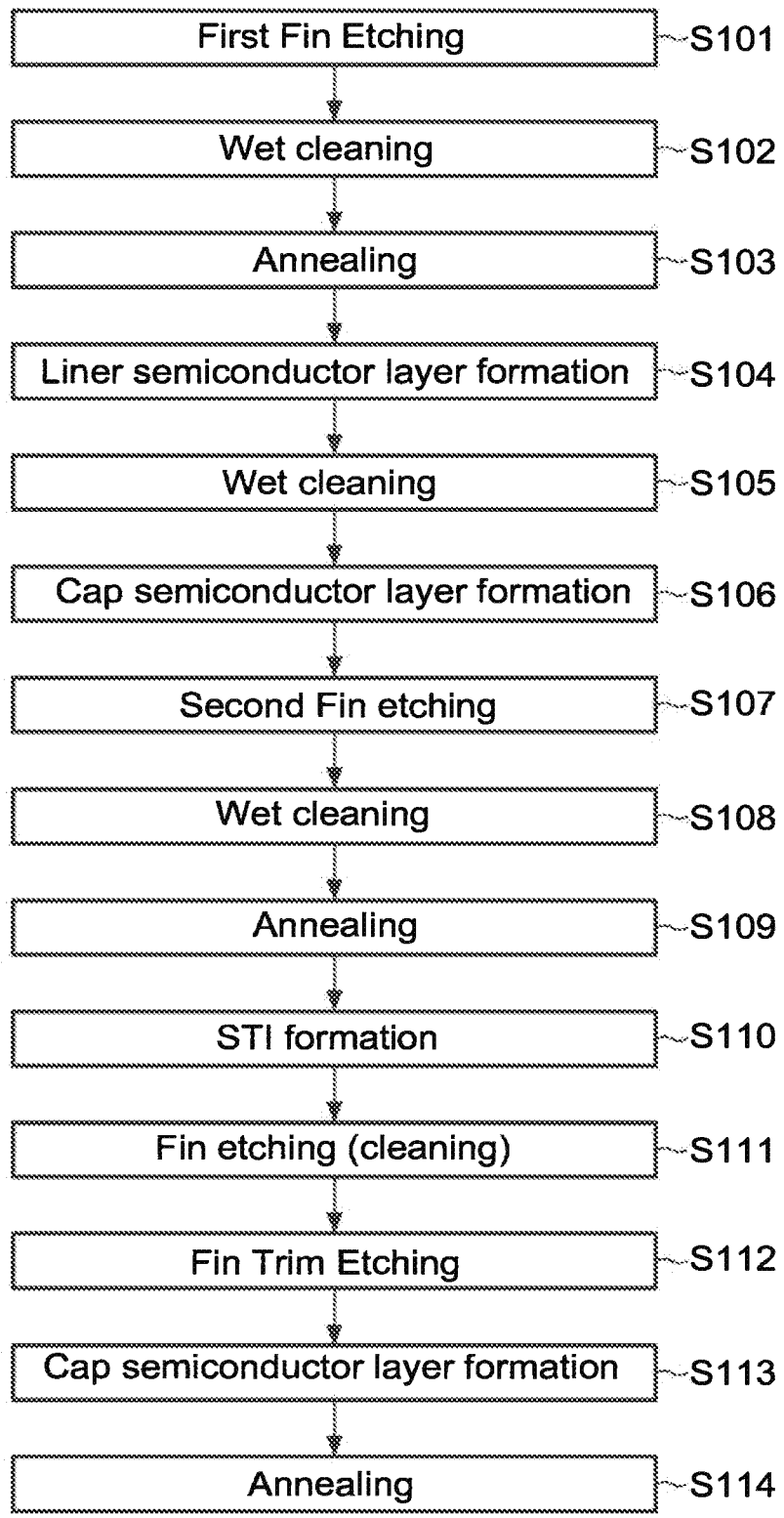
FIG. 6 shows a flow chart of a sequential manufacturing operation of a FinFET device according to an embodiment of the present disclosure.

FIGS. 1A-5F show views of various stages of, and FIG. 6 shows a flow chart of a sequential manufacturing operation of a FinFET device according to an embodiment of the present disclosure. It is understood that additional operations can be provided before, during, and after processes shown by FIGS. 1A-5F and FIG. 6, and some of the operations described below can be replaced or eliminated, for additional embodiments of the method. The order of the operations/processes may be interchangeable.

Figure 1A:
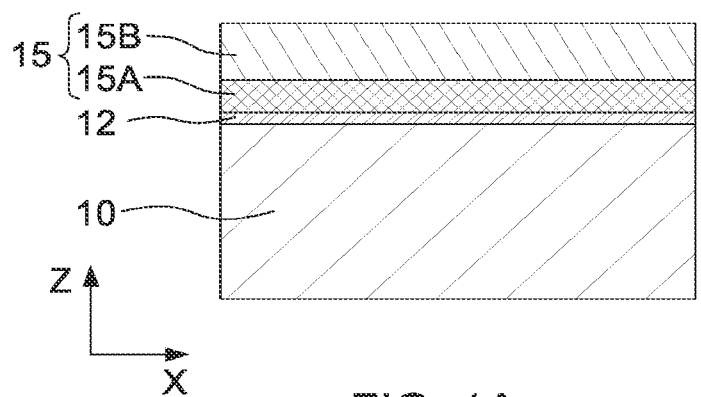
FIGS. 1A, 1B, 1C and 1D show cross sectional views of various stages of a sequential process for manufacturing a FinFET device according to an embodiment of the present disclosure.

In some embodiments, as shown in FIG. 1A, a hard mask layer 15 is formed over a substrate 10. In one embodiment, substrate 10 includes a single crystalline semiconductor layer on at least its surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In one embodiment, the substrate 10 is made of Si. The substrate 10 may include various regions that have been suitably doped with impurities (e.g., p-type or n-type conductivity). The dopants are, for example boron ($BF_2$) for an n-type FinFET and phosphorus, arsenic for a p-type FinFET.

In some embodiments, the mask layer 15 includes a first mask layer 15A and a second mask layer 15B. In some embodiments, the first mask layer 15A includes a silicon nitride layer, and the second mask layer 15B includes a silicon oxide layer. The first and second mask layers 15A and 15B are formed by chemical vapor deposition (CVD), physical vapor deposition (PVD) including sputtering, atomic layer deposition (ALD), or other suitable film formation process. In some embodiments, a pad oxide layer 12 made of a silicon oxide, which can be formed by a thermal oxidation, is formed before the first mask layer 15A is formed.

Figure 1B:
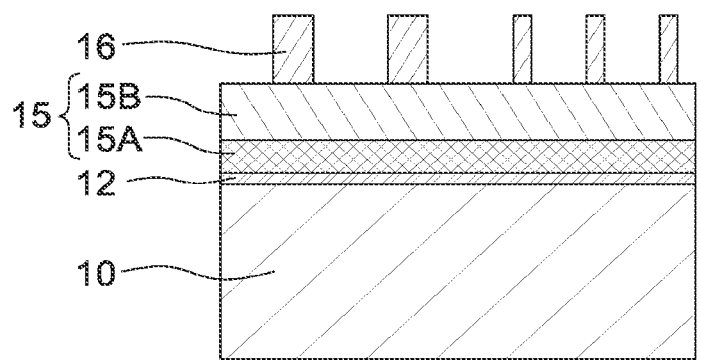
Figure 1C:
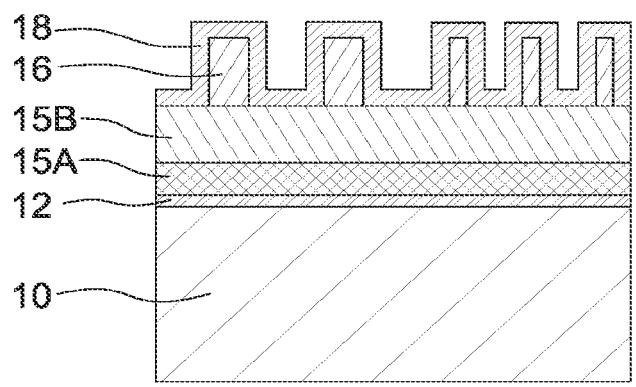
Figure 1D:
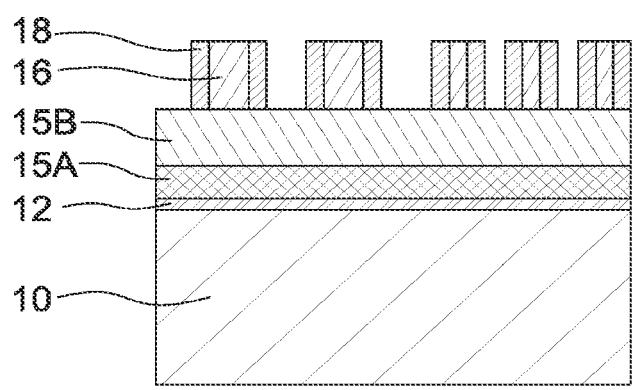
Figure 2A:
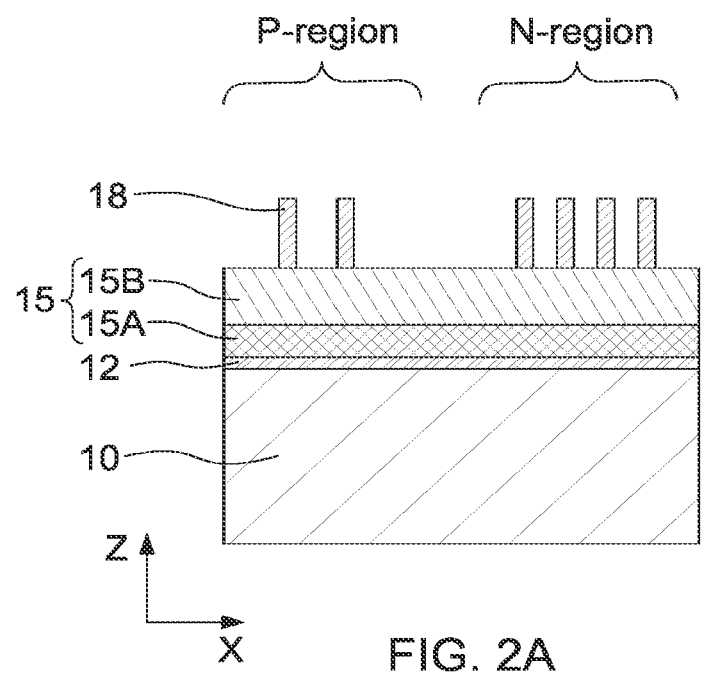
FIGS. 2A, 2B, 2C and 2D show cross sectional views of various stages of a sequential process for manufacturing a FinFET device according to an embodiment of the present disclosure.

In some embodiments, fin structures are formed by using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, as shown in FIG. 1B, a sacrificial layer is formed over a substrate and patterned using one or more photolithography and etching processes, to form mandrel patterns (sacrificial patterns) 16. Then, a blanket layer 18 is formed as shown in FIG. 1C, and anisotropic etching is performed to form sidewall spacers 18 alongside the mandrel patterns using a self-aligned process, as shown in FIG. 1D. Then, the mandrel patterns 16 are removed, and the remaining spacers 18 are used as a mask pattern 18 as shown in FIG. 2A. In some embodiments, one or more additional sidewall formation processes are performed to form mask patterns having further reduced pitches.

As shown in FIG. 2A, the mask pattern 18 includes a plurality of line patterns corresponding to one or more fin structures in a p-type region and one or more fin structures for an n-type region. In some embodiments, a pitch of the mask pattern 18 in the p-type region is greater than a pitch of the mask pattern 18 in the n-type region.

Figure 2B:
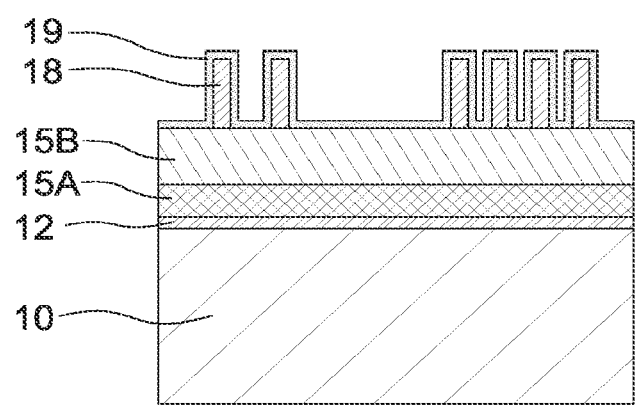

Further, as shown in FIG. 2B, a cap layer 19 is further formed over the mask pattern 18 in some embodiments. In some embodiments, the cap layer 19 is made of one or more of silicon oxide, silicon nitride, silicon oxynitride (SiON), SiOCN, SiCN, fluorine-doped silicate glass (FSG), or a low-k dielectric material. In some embodiments, the cap layer 19 is formed by ALD. In some embodiments, a thickness of the cap layer 19 is in a range from about 0.5 nm to about 5 nm.

Figure 2C:
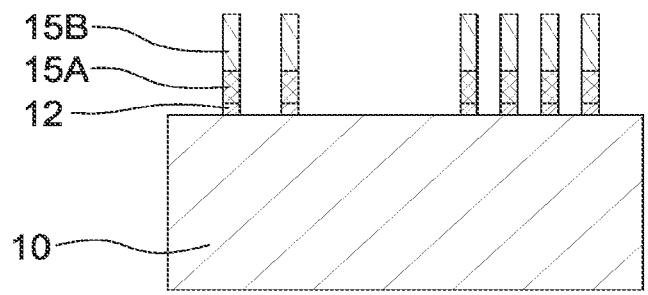
Figure 2D:
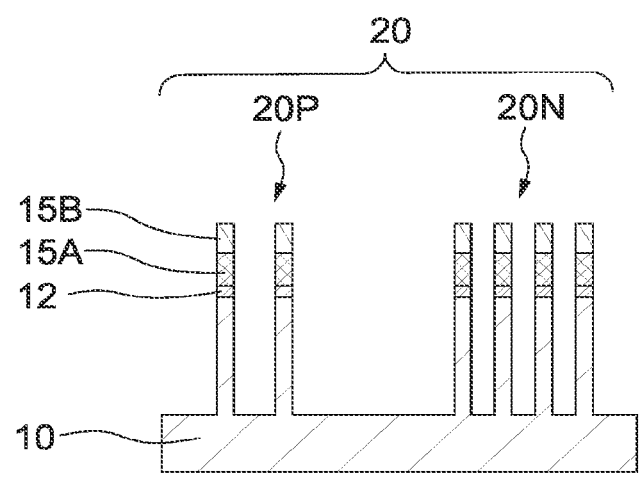

Then, the mask layer 15 and the pad oxide layer 12 are patterned by using one or more etching operations, as shown in FIG. 2C. Further, at S101 of FIG. 6, the substrate 10 is patterned by using the patterned mask layer as an etching mask, thereby forming fin structures 20N and 20P (collectively fin structures 20) extending in the Y direction. Details of the fin etching are explained below. In some embodiments, the fin structures 20N are for an n-type FET, and the fin structures 20P are for a p-type FET. In FIG. 2D, two fin structures 20P are arranged in the X direction in the p-type region and four fin structures 20N are arranged in the X direction in the n-type region. However, the number of the fin structures is not limited to two or four, and may be as small as one and three or more. In some embodiments, one or more dummy fin structures are formed on both sides of the fin structures 20 to improve pattern fidelity in the patterning operations.

Figure 7A:
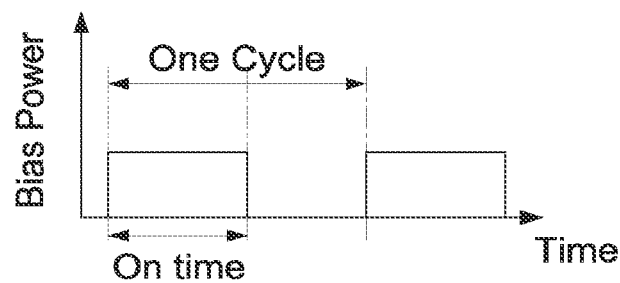
FIG. 7A shows a pulsed-bias etching operation according to an embodiment of the present disclosure and FIG. 7B shows a pulsed-bias etching according to an embodiment of the present disclosure.
Figure 7B:
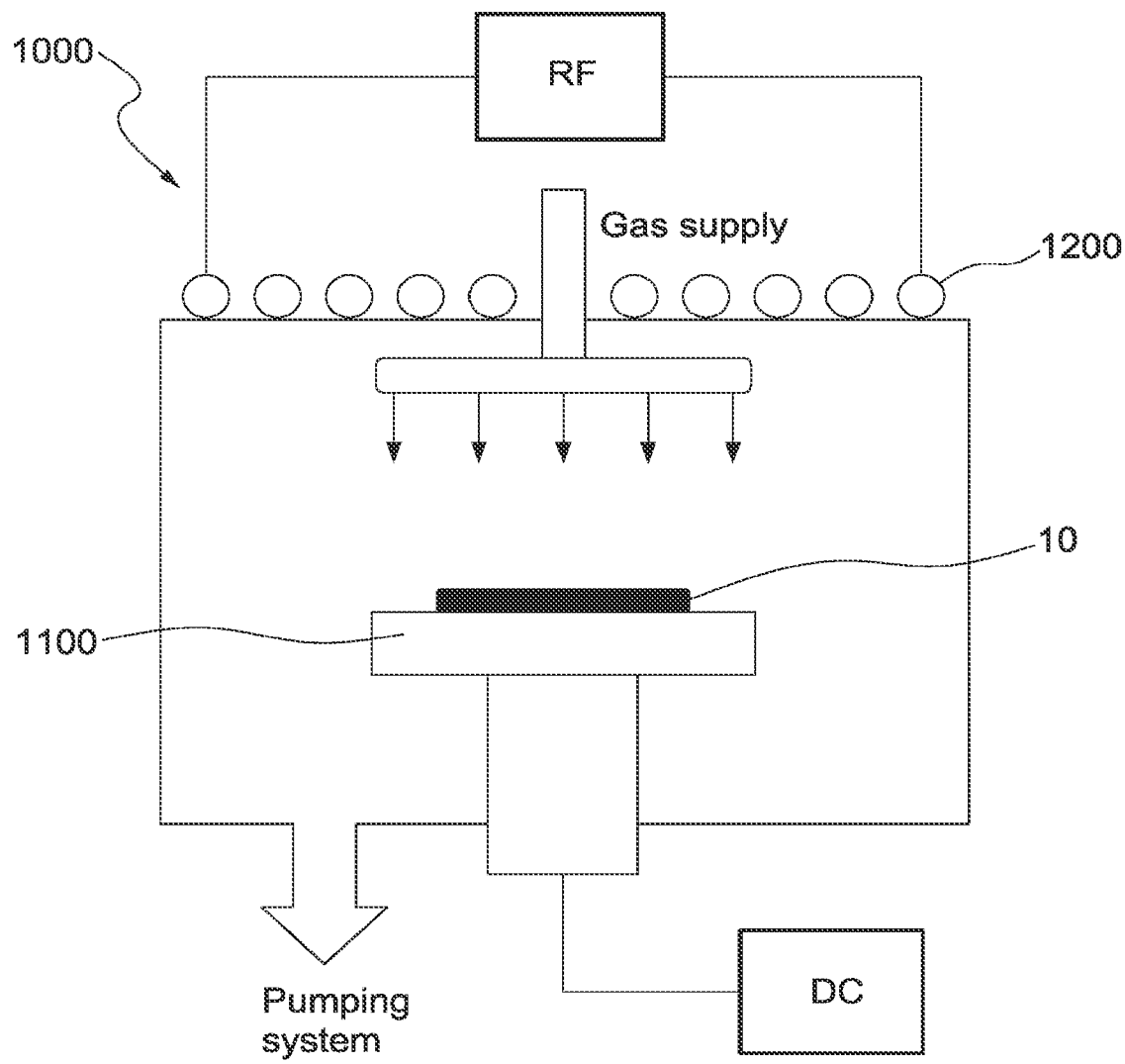

In some embodiments, the fin etching process includes pulsed-bias etching using a plasma etching apparatus 1000 shown in FIG. 7B. FIG. 7A shows a pulsed-bias etching operation according to embodiments of the present disclosure. In some embodiments, the substrate 10 is placed on a wafer stage 1100 of an etching chamber, and the substrate 10 and/or the wafer stage 1100 is biased with, for example, DC voltage. RF power (transformer coupled plasma (TCP) power) is applied to a counter electrode 1200 which is a coil disposed over or around the etching chamber in some embodiments.

During a plasma etching operation, a DC bias voltage is applied to a wafer stage 1100 and an RF power is applied to a TCP electrode. In a TCP plasma, a coil electrode 1200 is placed over or around a plasma etching chamber and an RF power is applied to the coil electrode 1200. In a pulsed bias method, the bias voltage is applied as a pulse as shown in FIG. 7A, while the power of the RF voltage is constant.

In some embodiments, a high (or on) value of the DC pulsed bias voltage (V1) is in a range from about 100 V to about 900 V, and is in a range from about 200 V to about 400 V in other embodiments. In some embodiments, the low value of the DC pulse bias is zero (off). In some embodiments, the power of RF voltage is in a range from about 400 W to about 1200 W, and is in a range from about 600 W to 1000 W in other embodiments.

In some embodiments, the frequency (1/(one cycle)) of the pulsed bias voltage is in a range from about 200 Hz to about 8000 Hz and is in a range from about 1000 Hz to about 4000 Hz in other embodiments.

A duty ratio (on-to-off cycle ratio) of the pulses is in a range from about 10% to about 80% in some embodiments, is in a range from about 20% to 60% in other embodiments. The duty ratio can be any range of two values among 10%, 20%, 30%, 40%, 50%, 60%, 70% and 80%.

In some embodiments, source gases for the fin etching operation include one or more selected from the group consisting of HBr, $O_2$, $SF_6$, $Cl_2$, $CHF_3$, $CO_2$, $CH_3F$, $C_4F_8$, $C_4F_6$, $CF_4$, $NF_3$, Ar, $H_2$ and He. The source gas includes at least one hydrogen source gas (e.g., HBr, $CHF_3$, $CH_3F$ and/or $H_2$), at least one fluorine source gas ($SF_6$, $CHF_3$ $CH_3F$ and/or $NF_3$) and at least one carrier gas (Ar, $H_2$ and/or He). A pressure during the asymmetric pulse bias etching is in a range from about 1 mTorr to about 100 mTorr in some embodiments, and is in a range from about 10 mTorr to about 50 mTorr in other embodiments. It should be noted that the plasma source gases include passivating gas (such as $C_4F_8$, $C_4F_6$, $O_2$ etc.) and etchant gas ($SF_6$, $NF_3$, $CF_4$, etc.) as mixture or in alternating cycles. During passivating gas cycle, a passivating layer is formed (similar like during bias off stage), while during the etching gas cycle, the passivating layer at bottom is removed and etching progress toward the trench bottom (similar like during bias on stage).

Figure 7C:
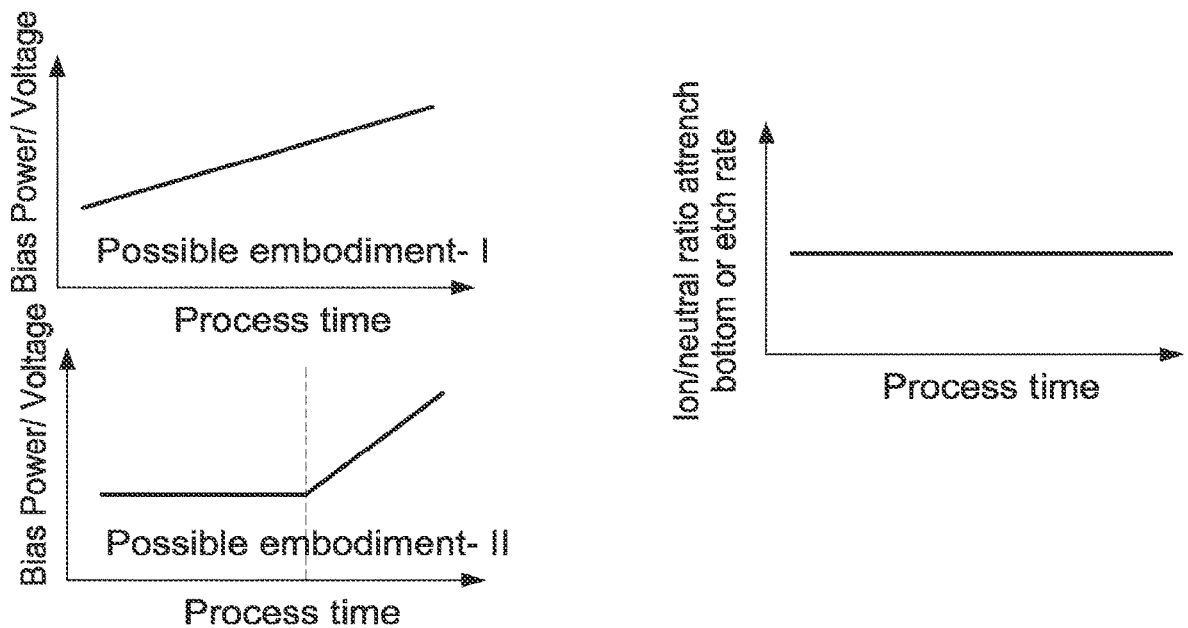
FIGS. 7C and 7D also show pulsed-bias etching operations according to embodiments of the present disclosure.

In some embodiments, as shown in FIG. 7C, the bias voltage or the bias power changes during the etching. In some embodiments, the bias voltage or the bias power monotonously (e.g., linearly) increases during the etching. In other embodiments, the bias voltage or the bias power is constant until the etching reaches a certain depth (e.g., about 30-50% of the total target depth), the bias voltage or the bias power increases. In a case of constant bias power, neutral species accumulate on sidewalls of the upper portion of the fin structure, which creates a tapered shape, and a ratio of active ions to natural species at the trench (fins) bottom starts decreasing with the process time. In contrast, by using the pulsed bias, it is possible to keep the ratio of the active ions to the neutral species constant at even the trench bottom by increasing bias power or voltage with process time, which can avoid an undesired tapered shape.

Figure 7D:
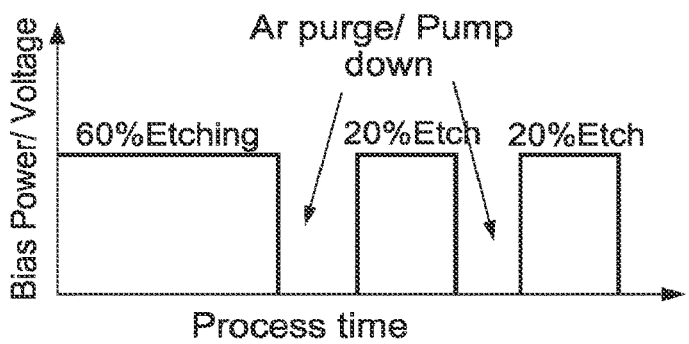

Further, in some embodiments, as shown in FIG. 7D, one or more purge operations are performed during the etching. The excessive neutral species deposited on the sidewalls of the fin structures are removed or reduced by applying cyclic purge using, for example, inert gas (Ar, He, etc.), or by pumping out during the etching process. In some embodiments, the purging operations are performed at about 55-65% (e.g., 60%) of the total target depth, and/or every 15-25% (e.g., 20%) of the total target depth. In certain embodiments, the purging operations are performed, at about 55-65% (e.g., 60%) and at about 75-85% (e.g., 80%) of the total target depth.

Further, in some embodiments, the active ions at the bottom of trench are neutralized by applying charge to the substrate (wafer or the substrate holder) that block further etching. In some embodiments, the substrate bias voltage is more than zero and within +/−5V. The substrate bias is applied periodically in some embodiments.

Figure 8A:
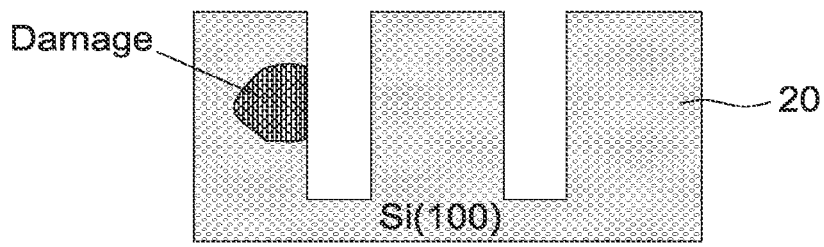
FIG. 8A shows damage caused in a sidewall of the fin structure.

As shown in FIG. 8A, the plasma etching containing hydrogen source and fluorine source gases may cause damage on sidewalls of the etched fin structure by hydrogen and fluorine ion bombardment and diffusion into the fin structures. In some embodiments, damaged areas are amorphous or poly-crystalline silicon. For example, when silicon includes about 8-20% of hydrogen, the area may become amorphous, and when silicon includes about 3-8% of hydrogen, the area may become poly-crystalline. The damage on the sidewalls of the fin structure becomes a triangular defect of silicon oxide in the subsequent processes. It should be noted that the amorphous silicon portion including hydrogen is different from a hydrogenated amorphous film (a-Si:H). Although both contain hydrogen, an a-Si:H film has more Si—H bonds which act as dangling bonds and maintain strain in the film. The presence of hydrogen in the amorphous silicon network leads to an increase in the material resistivity to the plastic deformation. Further, hardness of a-Si:H is as same as c-Si material. In contrast, the hydrogen content in the damaged area of the fin structure generates amorphous Si, which create dangling bonds. Therefore, an initial hydrogen content in the damage area is in the range of about 8-20%, and then after annealing is reduced to about 1-3%.

In the present disclosure, however, the plasma dry etching using the pulsed bias voltage can suppress damage on the sidewalls of the etched fin structure by generating more vertical ion bombardments than the horizontal direction. As set forth above, one or more of the conditions of the pulsed bias etching as well as kinds and/or ratios of the source gases are adjusted to suppress the damage on the sidewalls of the fin structures. When the bias voltage (or power) is smaller than the aforementioned ranges, a ratio of neutral species to ions in the plasma increases, which causes more deposition, less etching and does not produce a required higher etching depth. When the bias voltage is greater than the aforementioned ranges, the electron temperature in the plasma becomes too high, which causes damage on the underlying layers. When the duty ratio is smaller than the aforementioned ranges, more neutral species are generated, and the etched profile (spaces) becomes tapered without obtaining a high etch depth. When the duty ratio is greater than the aforementioned ranges, more ion flux is generated, which causes damage to the underlying layers.

After the fin structures 20 are formed, at S102 of FIG. 6, one or more cleaning operations are performed. In some embodiments, a meniscus re-configuration cleaning using heated iso-propyl alcohol is used as the cleaning operation.

Figure 8B:
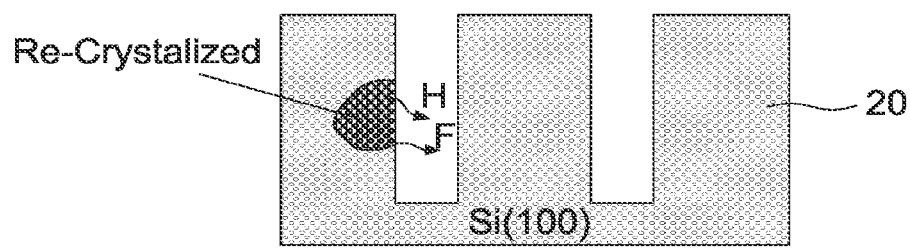
FIG. 8B shows a recovered damage (recrystalized area) by an annealing operation.

After the wet cleaning operation, at S103 of FIG. 6, a first annealing operation is performed. Even if damage is caused on the sidewalls of the fin structures, the damage is eliminated by the first annealing operation. In some embodiments, the annealing operation includes rapid thermal annealing at a temperature in a range from about 900° C. to about 1100° C. for about 1 sec to 20 sec. In other embodiments, the temperature is in a range from about 950° C. to 1050° C. In other embodiments, the time duration is in a range from about 5 sec to 15 sec. In some embodiments, the annealing operation is performed in an inert gas (Ar, He and/or $N_2$) ambient. In other embodiments, the annealing operation is performed under a pressure in a range from $1\times10^{-7}$ Torr to $5\times10^{-6}$ Torr. The annealing operation causes hydrogen and fluorine atoms to diffuse out from the fin structures and to re-crystalize the damaged areas as shown in FIG. 8B. When the temperature is lower than the aforementioned ranges, hydrogen and fluorine may not effectively be removed from the damaged areas of the fin structures, and when the temperature is higher than the aforementioned ranges, the fin structure may bend and be damaged. When the process time is shorter than the aforementioned ranges, hydrogen and fluorine may not be effectively removed from the damaged areas of the fin structures, and when the process time is longer than the aforementioned ranges, previously formed diffusion areas may be damaged.

Figure 3A:
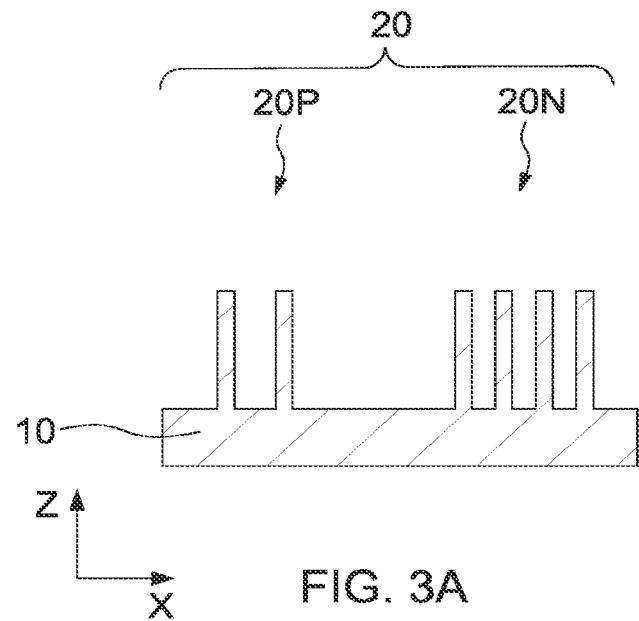
FIGS. 3A, 3B, 3C and 3D show cross sectional views of various stages of a sequential process for manufacturing a FinFET device according to an embodiment of the present disclosure.

FIG. 3A shows the structure after the annealing operation is performed. In some embodiments, before or after the annealing operation, the mask layer 15 and the pad oxide layer 12 are removed.

Figure 3B:
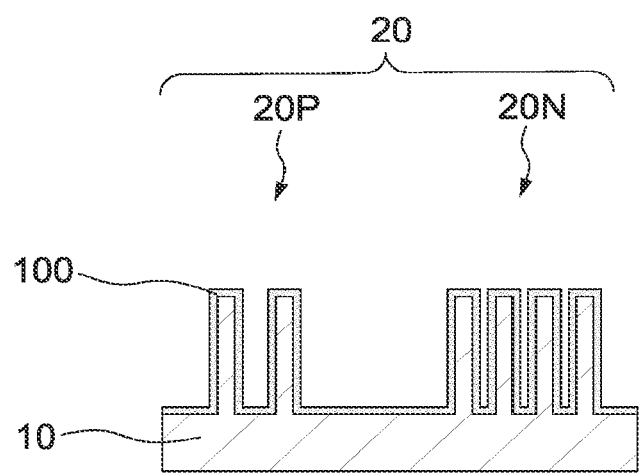

In some embodiments, after the annealing operation is performed, at S104 of FIG. 6, a liner semiconductor layer 100 is formed over the fin structures 20, as shown in FIG. 3B. In some embodiments, the liner semiconductor layer 100 includes silicon, SiGe or Ge. In certain embodiments, silicon is used. The liner semiconductor layer 100 is formed over the fin structures to prevent fin bending. In some embodiments, the thickness of the liner semiconductor layer 100 is in a range from about 0.2 nm to about 4 nm and is in a range from about 0.5 nm to about 2 nm, dependent on device and/or process requirements. In some embodiments, the silicon liner layer 100 is epitaxially grown by an LPCVD process, molecular beam epitaxy, atomic layer deposition or any other suitable method. The LPCVD process is performed at a temperature of about 400° C. to 850° C., which is lower than the annealing temperature, and under a pressure of about 1 Torr to 200 Torr, using a silicon source gas such as $SiH_4$, $Si_2H_6$, or $Si_3H_8$. If SiGe or Ge is formed, the source gas includes one or more of $GeH_4$, or $G_2H_6$. In some embodiments, the liner semiconductor layer 100 is non-doped and in other embodiments, the liner semiconductor layer 100 is appropriately doped for the n-type fin structures 20N and p-type fin structures 20P.

Figure 3C:
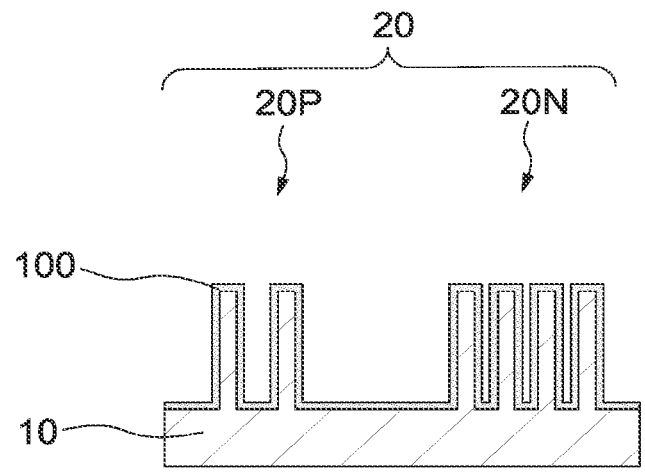

After the liner semiconductor 100 is formed, at S105 of FIG. 6, one or more wet cleaning operations are performed in some embodiments. In some embodiments, a wet cleaning solution includes aqueous solutions of ammonia ($NH_3$) and hydrogen peroxide ($H_2O_2$) and/or aqueous solutions of hydrochloric acid (HCl) and hydrogen peroxide ($H_2O_2$). During the wet cleaning operation, the liner semiconductor layer 100 (and the fin structures 20 in some embodiments) is slightly etched, as shown in FIG. 3C.

Figure 3D:
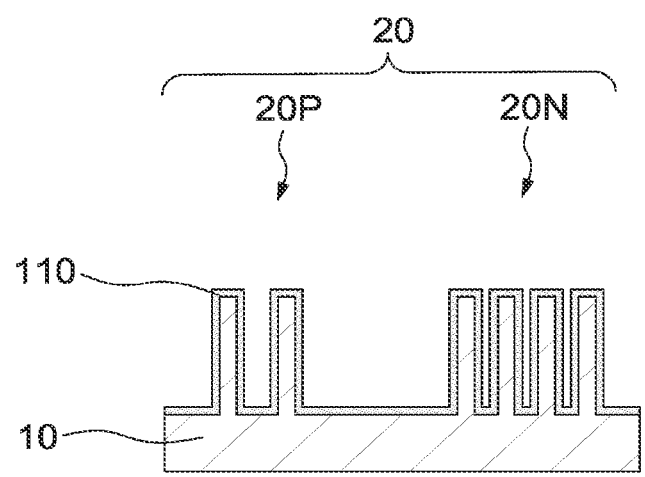

Then, in some embodiments, at S106 of FIG. 6, a cap semiconductor layer 110 is formed over the fin structures 20, as shown in FIG. 3D. In some embodiments, the cap semiconductor layer 110 includes silicon, SiGe or Ge. In certain embodiments, silicon is used. The cap semiconductor layer 110 is formed over the fin structures to adjust dimensions (width) of the fin structures. In some embodiments, the thickness of the cap semiconductor layer 110 is in a range from about 0.2 nm to about 4 nm and is in a range from about 0.5 nm to about 2 nm, dependent on device and/or process requirements. In some embodiments, the cap semiconductor 110 is epitaxially grown similar to the liner semiconductor layer 100. In some embodiments, the cap semiconductor layer 110 is non-doped and in other embodiments, the cap semiconductor layer 110 is appropriately doped for the n-type fin structures 20N and p-type fin structures 20P.

FIG. 4A is a plan view (projected view) of the fin structures 20 after the cap semiconductor layer 110 is formed. Next, as shown in FIG. 4B, at S107 of FIG. 6, the fin structures 20 are cut into short pieces to form individual fin structures by using one or more lithography and etching operations as the second fin etching. In some embodiments, plasma dry etching similar to the fin etching as set forth above is used. In some embodiments, one or more unnecessary fin structures (e.g., dummy fin structures) are also removed by the etching. After the plasma dry etching, a photo resist layer used in the lithography process is removed by, for example, an oxygen plasma ashing process.

After the second fin etching, at S108 of FIG. 6, one or more cleaning operations are performed. In some embodiments, a meniscus re-configuration cleaning using heated iso-propyl alcohol is used as the cleaning operation at a room temperature to about 200° C.

After the wet cleaning operation, at S109 of FIG. 6, a second annealing operation is performed. In some embodiments, damage is caused to the sidewalls of the fin structures in the second fin etching operation, and the damage, if caused, is eliminated by the second annealing operation. The second annealing operation causes hydrogen and fluorine atoms to diffuse out from the fin structures and re-crystalizes the damaged areas. The conditions of the second annealing operation are the same as or similar to the first annealing operation. In some embodiments, the annealing temperature in the second annealing operation is different (lower or higher) than the annealing temperature in the first annealing operation. In some embodiments, the second annealing operation is not performed.

Subsequently, at S110 of FIG. 6, an isolation insulating layer 30 is formed as shown in FIG. 4C. In some embodiments, an insulating material layer including one or more layers of insulating material is formed over the substrate so that the fin structures 20 are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surfaces of the fin structures 20 are exposed from the insulating material layer. Then, as shown in FIG. 4C, the insulating material layer is recessed to form an isolation insulating layer 30 so that the upper portions (channel regions) of the fin structures 20 are exposed. With this operation, the fin structures 20 are electrically separated from each other by the isolation insulating layer 30, which is also called shallow trench isolation (STI).

In some embodiments, before the isolation insulating layer 30 is formed, one or more insulating liner layer is formed over the fin structures 20. The insulating liner layer includes silicon oxide, silicon nitride, silicon oxynitride (SiON), SiOCN, SiCN, or any other suitable material. The insulating liner layer formed on the channel regions of the fin structures is removed when the isolation insulating layer 30 is recessed, and the lower part of the fin structures is covered by the insulating liner layer in the isolation insulating layer 30.

After the isolation insulating layer 30 is formed, at S111 of FIG. 6, one or more wet cleaning operations are performed in some embodiments. In some embodiments, a thin oxide layer formed on the channel region of the fin structures 20 is removed. In some embodiments, the channel region of the fin structure exposed from the isolation insulating layer is also slightly etched.

Then, in some embodiments, at S112 of FIG. 6, the channel region of the fin structures 20 are trimmed (etched), as shown in FIG. 4D. In some embodiments, one or more dry etching and/or wet etching are performed. In some embodiments, a wet etching using a tetramethylammonium hydroxide (TMAH) aqueous solution and/or a KOH aqueous solution is used as a wet etchant. In other embodiments, a chemical dry etching using an HCl gas is used to trim the channel region. In some embodiments, a trimming (etching) amount is in a range from about 0.2 nm to about 2.0 nm and is in a range from about 0.5 nm to about 1.0 nm in other embodiments.

If the plasma etching damage remains on the sidewalls of the channel region of the fin structures, the trimming etching operation may etch the damaged area, causing a triangular cavity or pit exposing (111) facets. In the present embodiments, however, since the first and/or second annealing operations to remove the damage are performed before the fin trimming operation, the defect etching to the channel region does not occur.

After the trimming etching, in some embodiments, at S113 of FIG. 6, a cap semiconductor layer 120 is formed over the channel regions of fin structures 20, as shown in FIG. 5A. In some embodiments, the cap semiconductor layer 120 includes silicon, SiGe or Ge. In certain embodiments, silicon is used. The cap semiconductor layer 120 is formed over the fin structures to adjust dimensions (width) of the fin structures and also control out-diffusion of Ge from SiGe or Ge layers, if used. In some embodiments, the thickness of the cap semiconductor layer 120 is in a range from about 0.2 nm to about 4 nm and is in a range from about 0.5 nm to about 2 nm in other embodiments, depending on device and/or process requirements. In some embodiments, the cap semiconductor 120 is epitaxially-grown similar to the liner semiconductor layer 100 and/or the cap semiconductor layer 110. In some embodiments, the cap semiconductor layer 120 is non-doped and in other embodiments, the cap semiconductor layer 120 is appropriately doped for the n-type fin structures 20N and p-type fin structures 20P.

After the cap semiconductor layer 120 is formed, at S114 of FIG. 6, a third annealing operation is performed. In some embodiments, the annealing operation includes rapid thermal annealing at a temperature in a range from about 900° C. to about 1100° C. for about 0.1 sec to 10 sec. In other embodiments, the temperature is in a range from about 950° C. to 1050° C. In other embodiments, the time duration is in a range from about 0.5 sec to 5 sec. In some embodiments, the annealing operation is performed in a mixed gas of $N_2$ and $O_2$, where the oxygen concentration is in a range from about 0.1% to 0.5%.

After the third annealing operation, sacrificial gate structures 40 are formed over the fin structures, as shown in FIG. 5B. In some embodiments, the sacrificial gate structures 40 include a sacrificial dielectric layer, a sacrificial gate electrode layer and a hard mask layer. The sacrificial gate dielectric layer includes one or more layers of insulating material, such as a silicon oxide-based material. In one embodiment, silicon oxide formed by CVD is used. The thickness of the sacrificial gate dielectric layer is in a range from about 1 nm to about 5 nm in some embodiments. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. The hard mask layer is used to form the sacrificial gate electrode layer and includes one or more layers of silicon nitride and silicon. In some embodiments, the sacrificial gate dielectric layer also covers the source/drain region of the fin structures 20.

After the sacrificial gate structures 40 are formed, a blanket layer of an insulating material for sidewall spacers is conformally formed by using CVD or other suitable methods. The blanket layer is deposited in a conformal manner so that it is formed to have substantially equal thicknesses on vertical surfaces, such as the sidewalls, horizontal surfaces, and the top of the sacrificial gate structure. In some embodiments, the blanket layer is deposited to a thickness in a range from about 2 nm to about 10 nm. In one embodiment, the insulating material of the blanket layer is a silicon nitride-based material, such as SiN, SiON, SiOCN or SiCN and combinations thereof. The sidewall spacers are formed on opposite sidewalls of the sacrificial gate structures 40.

In the embodiment of FIG. 5B, one sacrificial gate structure 40 is disposed over two fin structures 20P in the p-type region, and one sacrificial gate structure 40 is disposed over four fin structures 20N in the n-type region. However, the number of the fin structures per sacrificial gate structure is not limited, and can be one, two, three or more than four. In other embodiments, one sacrificial gate structure is formed over one or more n-type fin structures 20N and one or more p-type fin structures 20P.

Subsequently, a source/drain epitaxial layer 62 and 64 is formed (see, FIG. 5F). In some embodiments, the fin structures of source/drain regions are recessed down below the upper surface of the isolation insulating layer 30 by using dry etching and/or wet etching, and then one or more semiconductor layers are epitaxially formed over the recessed fin structures. In other embodiments, one or more semiconductor layers are epitaxially formed over the source/drain region of the non-recessed fin structure. The source/drain epitaxial layer 62 for an n-type FET includes one or more layers of SiC, SiP and SiCP, and the source/drain epitaxial layer 64 for a p-type FET includes one or more layers of SiGe, SiGeSn, which may be doped with B. In at least one embodiment, the epitaxial layers are epitaxially grown by an LPCVD process, molecular beam epitaxy, atomic layer deposition or any other suitable method. The LPCVD process is performed at a temperature of about 400° C. to about 850° C. and under a pressure of about 1 Torr to about 200 Torr, using silicon source gas such as $SiH_4$, $Si_2H_6$, or $Si_3H_8$; germanium source gas such as $GeH_4$ or $G_2H_6$; carbon source gas such as $CH_4$ or $SiH_3CH_3$; phosphorus source gas such as $PH_3$; and/or boron source gas such as $B_2H_6$. In some embodiments, two or more layers with different compositions (e.g., different P, C, Ge and/or B concentrations) are formed as the source/drain epitaxial layers.

Subsequently, a first interlayer dielectric (ILD) layer 50 is formed over the source/drain epitaxial layers and the sacrificial gate structures 40, as shown in FIG. 5C. Then, a planarization operation, such as CMP, is performed, so that the top portion of the sacrificial gate electrode layer is exposed. The materials for the first ILD layer 50 include compounds comprising Si, O, C and/or H, such as silicon oxide, SiCOH and SiOC. Organic materials, such as polymers, may be used for the first ILD layer 50.

Next, the sacrificial structure 40 including sacrificial gate electrode layer and the sacrificial gate dielectric layer are removed, thereby exposing the upper portions (channel regions) of the fin structures 20, as shown in FIG. 5D. The sacrificial gate structures 40 can be removed using plasma dry etching and/or wet etching. When the sacrificial gate electrode layer is polysilicon and the first ILD layer 50 is silicon oxide, a wet etchant such as a TMAH solution can be used to selectively remove the sacrificial gate electrode layer. The sacrificial gate dielectric layer is thereafter removed using plasma dry etching and/or wet etching.

After the sacrificial gate structures are removed, a gate dielectric layer 82 is formed over channel regions (upper portions of the fin structure 20 above the isolation insulating layer 30), and a gate electrode layer 84 is formed on the gate dielectric layer 82, as shown in FIG. 5E.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer formed between the channel layers and the dielectric material.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness over each channel layers. The thickness of the gate dielectric layer 82 is in a range from about 1 nm to about 6 nm in one embodiment.

The gate electrode layer 84 is formed on the gate dielectric layer 82. The gate electrode 84 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 84 may be formed by CVD, ALD, electro-plating, or other suitable method. The gate electrode layer is also deposited over the upper surface of the first ILD layer 50. The gate dielectric layer and the gate electrode layer formed over the first ILD layer 50 are then planarized by using, for example, CMP, until the top surface of the first ILD layer 50 is revealed. In some embodiments, after the planarization operation, the gate electrode layer 84 is recessed and a cap insulating layer is formed over the recessed gate electrode 84. The cap insulating layer includes one or more layers of a silicon nitride-based material, such as SiN. The cap insulating layer can be formed by depositing an insulating material followed by a planarization operation.

In certain embodiments of the present disclosure, one or more work function adjustment layers (not shown) are interposed between the gate dielectric layer 82 and the gate electrode 84. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

In the FET formed in the aforementioned embodiments, the fin sidewalls show a low surface roughness Ra less than about 1.8 nm (more than 0 nm) in some embodiments. In some embodiments, the hydrogen content in the fin structure is in a range from about $1 \times 10^{18}$ atoms/cm$^3$ to about $3 \times 10^{18}$ atoms/cm$^3$. In some embodiments, the crystallinity of the entire fin structure is more than about 90% and less than 100%. When a fin structure is formed by method other than the present embodiments, the crystallinity is less than about 30%. In some embodiments, the depth (height) variation of the fin structures are small, for example, less than about 3% of the average fin depth (measured for 50 fin structures) (more than 0%). When a fin structure is formed by method other than the present embodiments, the depth variation is about 10-20% of the average depth.

Figure 8C:
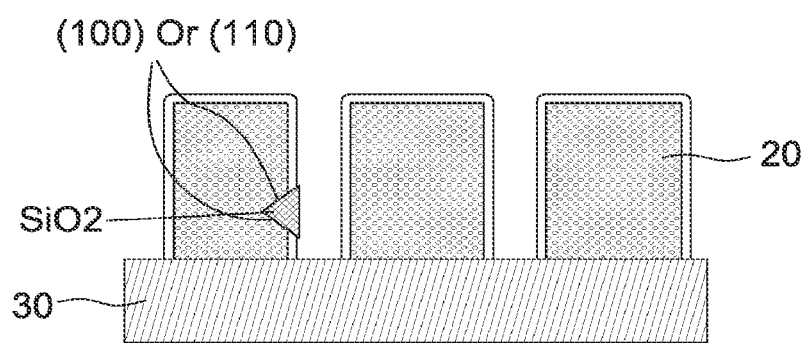
FIG. 8C shows a defect caused in a channel region of a fin structure.

In the foregoing embodiments, the pulsed bias voltage etching operation is employed to reduce damage on the fin structure, in particular, a deep trench area (e.g., a level below the upper surface of the isolation insulating layer). Even if damage is generated, the post annealing treatment reconstructs the damaged area to crystalline and the damaged area becomes oxide free. Thus, there is no possibility to damage the gate dielectric layer and the metal gate layer in the subsequent process. In some embodiments, a damaged area exists in the channel region above the upper surface of the isolation insulating layer, and the damaged area may not completely be removed by the annealing operations. However, the damaged area has only (100) and/or (110) facet and no (111) facet as shown in FIG. 8C, when the damaged area is reconstructed, the remaining damaged area (defect) becomes smaller, which does not affect the subsequent process. In some embodiments, the depth of the remaining defect is in a range from about 0.1 nm to about 0.5 nm.

It is understood that the semiconductor device shown in FIGS. 5E and 5F undergoes further CMOS processes to form various features such as contacts/vias, interconnect metal layers, dielectric layers, passivation layers, etc.

FIGS. 9A-9E show a sequential process for manufacturing a FinFET device according to an embodiment of the present disclosure. It is understood that additional operations can be provided before, during, and after processes shown by FIGS. 9A-9E, and some of the operations described below can be replaced or eliminated, for additional embodiments of the method. The order of the operations/processes may be interchangeable. Materials, configurations, dimensions, processes and/or operations as described with respect to the foregoing embodiments may be employed in the following embodiments, and detailed description thereof may be omitted. In this embodiment, the channel region of p-type FETs includes SiGe.

In some embodiments, a part of a substrate 10 corresponding to the p-type region(s) is etched to form a recess by one or more lithography and etching operations. Then, an epitaxial layer 11 is formed in the recess. In some embodiments, the epitaxial layer 11 is made of SiGe. In some embodiments, the germanium concentration of the SiGe layer 11 is in a range from about 5 atomic % to about 30 atomic %. In some embodiments, one or more buffer layer having a lower Ge concentration than the epitaxial layer 11 is formed between the epitaxial layer 11 and the substrate 10. The SiGe layer 11 can be formed by CVD, such as low pressure CVD (LPCVD) and plasma enhanced CVD (PECVD), physical vapor deposition (PVD), atomic layer deposition (ALD), molecular beam epitaxy (MBE), or any other suitable process. In some embodiments, after the epitaxial layer 11 is formed, a CMP operation is performed. The thickness of the epitaxially grown SiGe layer 11 (the depth of the recess) is in a range from about 30 nm to about 100 nm in some embodiments, and is in a range from 40 nm to 80 nm in other embodiments.

Then, the same as or similar operations to those explained with respect to FIGS. 1A-2D are performed as shown in FIGS. 9A-9D, thereby forming p-type fin structures 20P each having a SiGe layer for a channel region and n-type fin structures 20N. Subsequently, the same as or similar operations to those explained with respect to FIGS. 3A-5F are performed, and a p-type FinFET and an n-type FinFET are formed as shown in FIG. 9E.

FIGS. 10A-11D show a sequential process for manufacturing a FinFET device according to an embodiment of the present disclosure. It is understood that additional operations can be provided before, during, and after the processes shown by FIGS. 10A-11D, and some of the operations described below can be replaced or eliminated, for additional embodiments of the method. The order of the operations/processes may be interchangeable. Materials, configurations, dimensions, processes and/or operations as described with respect to the foregoing embodiments may be employed in the following embodiments, and detailed description thereof may be omitted. In this embodiment, the channel region of p-type FETs includes SiGe, and etchings for forming p-type fin structures and n-type fin structures are separately performed.

Figure 9A:
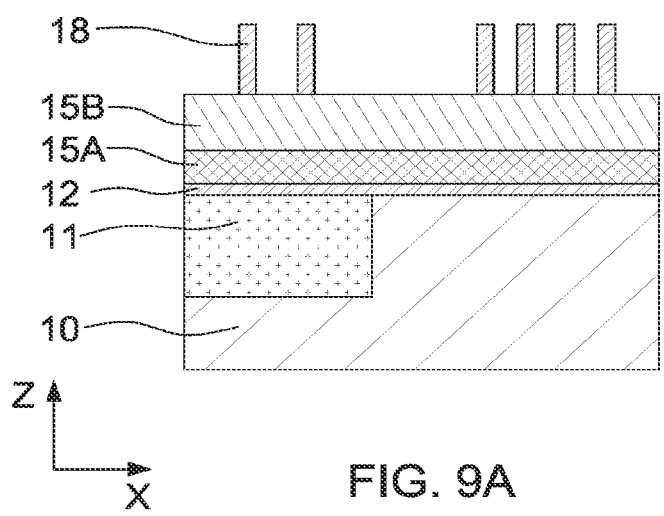
FIGS. 9A, 9B, 9C, 9D and 9E show cross sectional views of various stages of a sequential process for manufacturing a FinFET device according to an embodiment of the present disclosure.
Figure 9B:
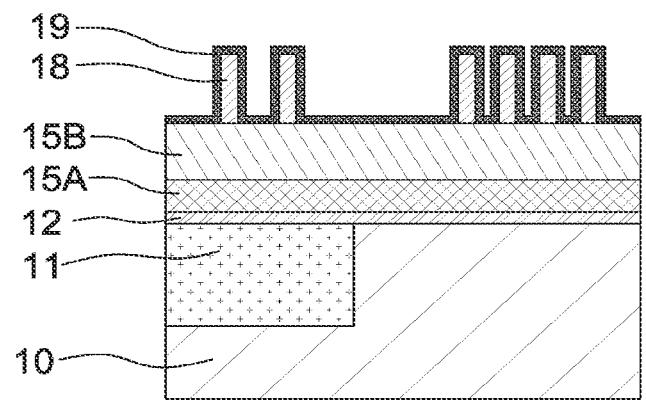
Figure 9C:
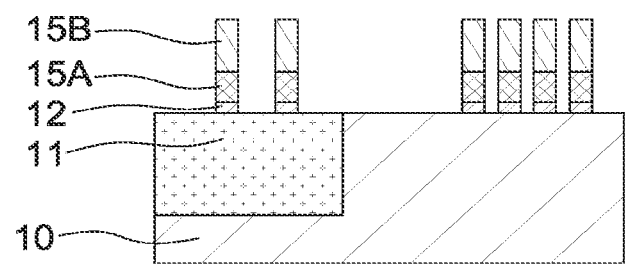
Figure 9D:
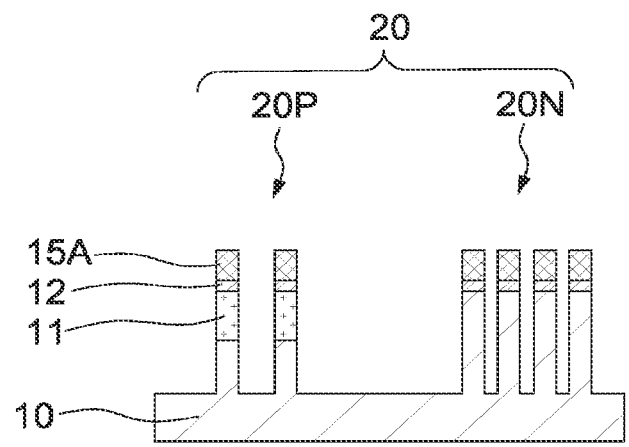
Figure 9E:
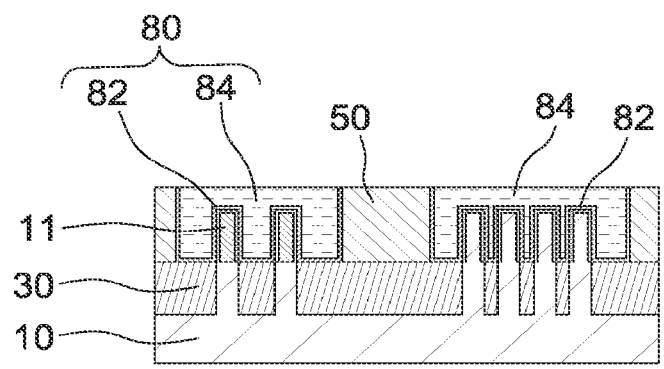
Figure 10A:
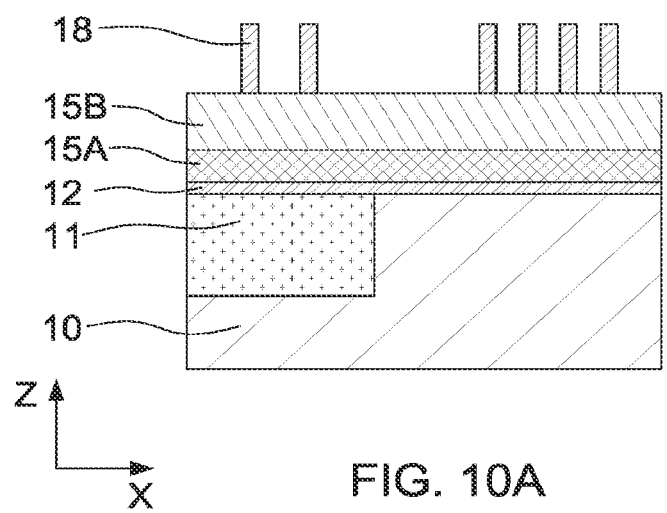
FIGS. 10A, 10B, 10C and 10D show cross sectional views of various stages of a sequential process for manufacturing a FinFET device according to an embodiment of the present disclosure.
Figure 10B:
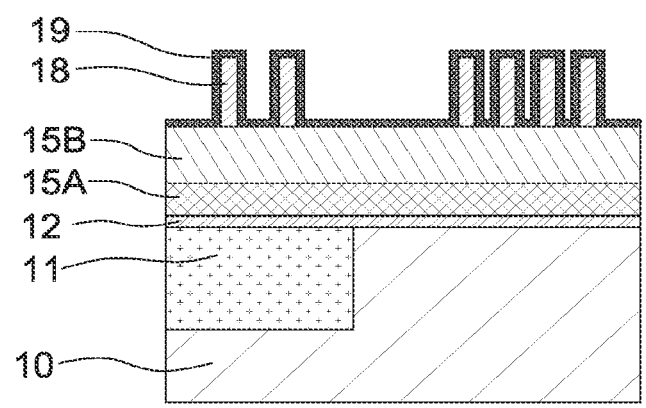
Figure 10C:
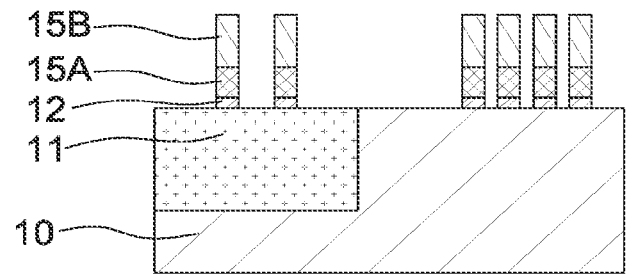
Figure 10D:
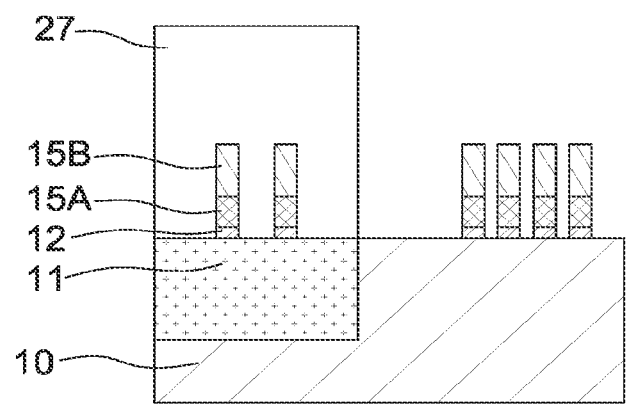
Figure 11A:
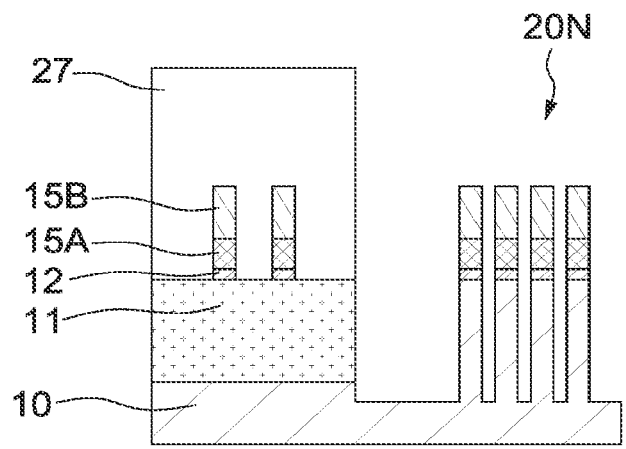
FIGS. 11A, 11B, 11C and 11D show cross sectional views of various stages of a sequential process for manufacturing a FinFET device according to an embodiment of the present disclosure.
Figure 11B:
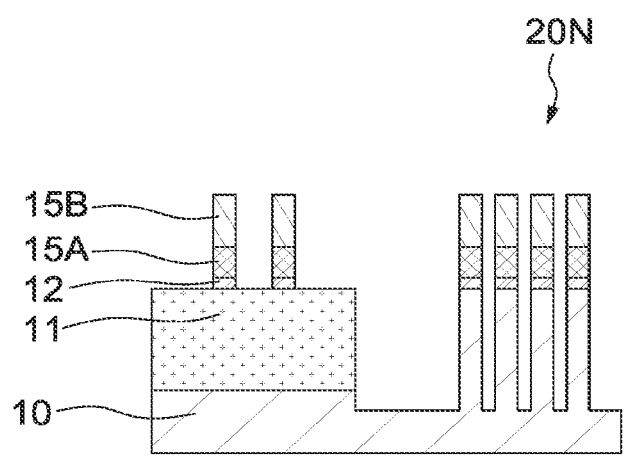
Figure 11C:
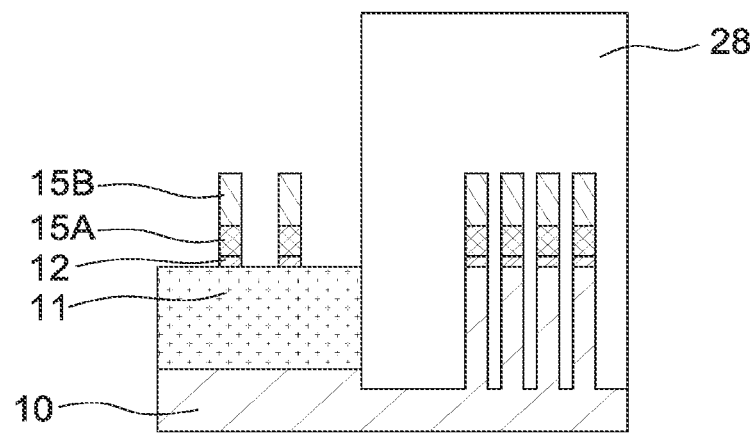
Figure 11D:
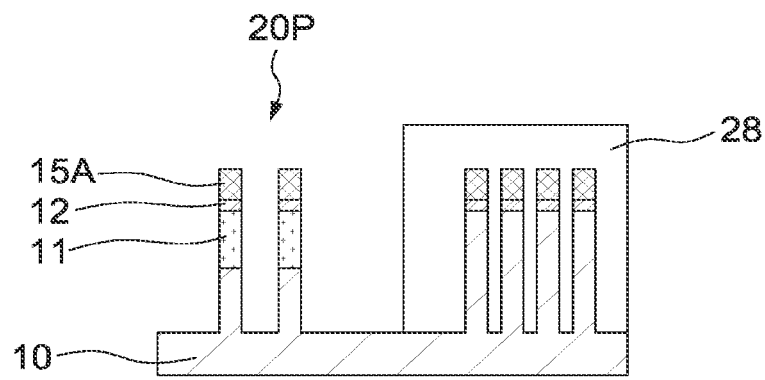

FIGS. 10A-10C are the same as FIGS. 9A-9C. As shown in FIG. 10D, the p-type region is covered by a cover layer 27, for example, a photo resist pattern. Then, as shown in FIG. 11A, the n-type fin structures 20N are formed by one or more plasma dry etching operations. Thereafter, the cover layer 27 is removed as shown in FIG. 11B. As shown in FIG. 11C, the n-type region is covered by a cover layer 28, for example, a photo resist pattern. Then, as shown in FIG. 11D, the p-type fin structures 20P are formed by one or more plasma dry etching operations. Thereafter, the cover layer 28 is removed, which results in the same or similar structure shown in FIG. 9D. Subsequently, the same as or similar operations to those explained with respect to FIGS. 3A-5F are performed, and a p-type FinFET and an n-type FinFET are formed as shown in FIG. 5F. In other embodiments, the n-type fin structures 20N are first formed and then the p-type fin structures 20P are formed.

Figure 12:
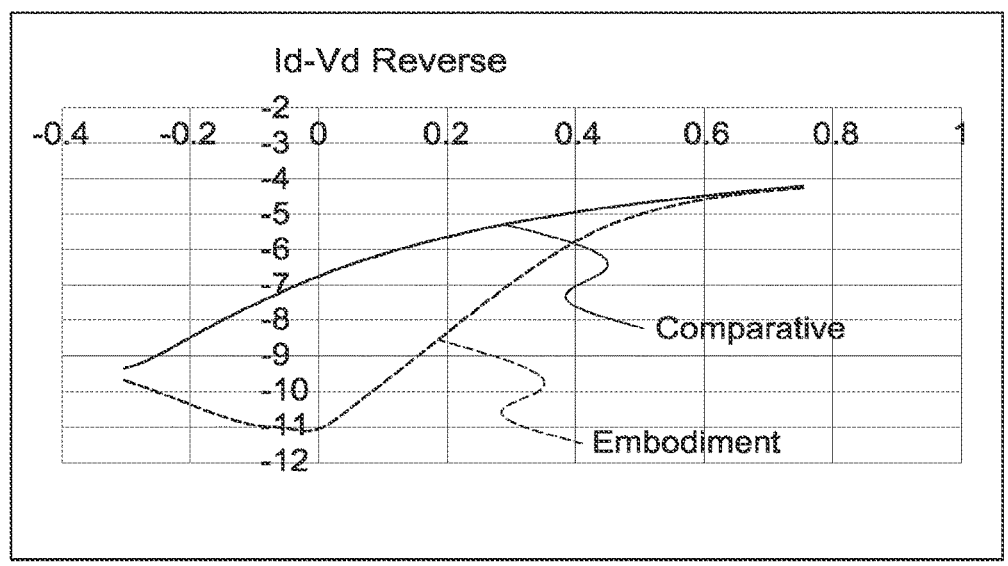
FIG. 12 shows advantageous effects of the present embodiments.

FIG. 12 shows advantageous effects of the present embodiments. In the comparative example, no pulse bias etching and no annealing operation subsequent to the fin etching are performed. As shown in FIG. 12, a FinFET manufactured by the present embodiments shows almost zero leak current (Id, off) (e.g., about 0.01 nA). The results indicate that in the present embodiments, defects or damage in the channel region of the fin structure are effectively suppressed or eliminated.

The various embodiments or examples described herein offer several advantages over the existing art. In the embodiments of the present disclosure, in a fin etching process, a pulsed bias voltage plasma etching followed by an annealing operation is employed to suppress or reduce damage on the sidewalls of the etched fin structure and to eliminate the damage, which can improve device performance and yield.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure is formed by patterning a semiconductor layer, and an annealing operation is performed on the fin structure. In the patterning of the semiconductor layer, a damaged area is formed on a sidewall of the fin structure, and the annealing operation eliminates the damaged area. In one or more of the foregoing and following embodiments, the semiconductor layer is a single crystalline semiconductor and the damaged area includes an amorphous area or a polycrystalline area. In one or more of the foregoing and following embodiments, the damaged area includes hydrogen and fluorine at a higher concentration than a remaining part of the fin structure. In one or more of the foregoing and following embodiments, the hydrogen and the fluorine are removed by the annealing operation. In one or more of the foregoing and following embodiments, the annealing operation recrystallizes the damaged area. In one or more of the foregoing and following embodiments, a process temperature of the annealing operation is in a range from 950° C. to 1050° C. In one or more of the foregoing and following embodiments, a process duration of the annealing operation is in a range from 5 sec to 15 sec.

In accordance with another aspect of the present disclosure, in a method for manufacturing a semiconductor device, a fin structure is formed by patterning a semiconductor layer, a cleaning operation is performed on the fin structure, after the cleaning operation, an annealing operation is performed on the fin structure, and after the annealing operation, patterning operation is performed on the fin structure to divide the fin structure into pieces. In the formation of the fin structure, a plasma dry etching with a pulsed bias voltage is employed, and in the annealing operation, a process temperature is in a range from 900° C. to 1100° C. and a process duration of the annealing operation is in a range from 1 sec to 20 sec. In one or more of the foregoing and following embodiments, the pulsed bias voltage comprises a frequency in a range from 200 Hz to 8000 Hz. In one or more of the foregoing and following embodiments, a duty ratio of the pulsed bias voltage is in a range from 0.2 to 0.6. In one or more of the foregoing and following embodiments, a voltage of the pulsed bias voltage is in a range from 100 V to 900 V. In one or more of the foregoing and following embodiments, the plasma dry etching comprises a mixed gas of at least one hydrogen source, at least one fluorine source and at least one carrier gas. In one or more of the foregoing and following embodiments, the plasma dry etching comprises forming a damaged area including an amorphous area or a polycrystalline area on a sidewall of the fin structure, and the annealing operation eliminates the damaged area. In one or more of the foregoing and following embodiments, the annealing operation is performed in an inert gas ambient.

In accordance with another aspect of the present disclosure, in a method for manufacturing a semiconductor device, a fin structure is formed by performing a first etching operation on a semiconductor layer, a first cleaning operation is performed on the fin structure, after the first cleaning operation, a first annealing operation is performed on the fin structure, after the first annealing operation, a second etching operation is performed on the fin structure to divide the fin structure into pieces, after the second etching operation, a second annealing operation is performed on the fin structure, and after the second annealing operation, an isolation insulating layer is formed such that an upper portion of the fin structure protrudes from the isolation insulating layer. In at least one of the first etching operation or the second etching operation, a damaged area including an amorphous area or a polycrystalline area is formed on a sidewall of the fin structure, and in at least one of the first annealing operation or the second annealing operation, the damaged area is eliminated. In one or more of the foregoing and following embodiments, the first cleaning operation uses a heated iso-propyl alcohol treatment. In one or more of the foregoing and following embodiments, a second cleaning operation using a heated iso-propyl alcohol treatment is further performed between the second patterning operation and the second annealing operation. In one or more of the foregoing and following embodiments, between the first annealing operation and the second patterning operation, a liner semiconductor layer is formed over the fin structure, a first wet etching operation is performed on the fin structure, and a first cap semiconductor layer is formed over the fin structure. In one or more of the foregoing and following embodiments, after the forming the isolation insulating layer, a second wet etching operation is performed, a trimming etching operation is performed on the fin structure, and a second cap semiconductor layer is formed over the fin structure. In one or more of the foregoing and following embodiments, after the second cap semiconductor layer is formed, a third annealing operation is performed in an ambient including oxygen.

In accordance with another aspect of the present disclosure, a semiconductor device includes a fin structure, an isolation insulating layer, from which a channel region of the fin structure protrudes, a gate structure over the channel region, and a source/drain epitaxial layer over a source/drain region of the fin structure. A surface roughness Ra of a sidewall of the fin structure is more than 0 nm to less 1.8 nm. In one or more of the foregoing and following embodiments, a crystallinity of the fin structure is more than 90% to less than 100%.

In accordance with another aspect of the present disclosure, a semiconductor device includes a plurality of fin structure disposed over a substrate, an isolation insulating layer, from which channel regions of the plurality of fin structure protrudes, a gate structure over one or more of the channel region, and a source/drain epitaxial layer over a source/drain region of one or more of the fin structures. A variation of heights of the plurality of fin structures is more than 0% to less than 3% of an average height of the plurality of fin structures. In one or more of the foregoing and following embodiments, a surface roughness Ra of a sidewall of the plurality of fin structures is more than 0 nm to less 1.8 nm. In one or more of the foregoing and following embodiments, a crystallinity of the plurality of fin structures is more than 90% to less than 100%.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   etching a substrate to form a fin structure comprising a first plurality of fins and a second plurality of fins over the substrate;
   eliminating damage to the plurality fins caused by the etching the substrate by heating the fin structure at temperature in a range from 900° C. to 1100° C. for 1 sec to 20 sec; and
   after the eliminating damage to the plurality of fins, forming an isolation insulating layer such that upper portions of the first plurality of fins and second plurality of fins protrudes from the isolation insulating layer.

2. The method of claim 1, wherein the first plurality of fins has a greater pitch than the second plurality of fins.

3. The method of claim 1, further comprising forming a first conductivity type material over the first plurality of fins and a second conductivity type material over the second plurality of fins.

4. The method of claim 1, wherein the etching the substrate includes a pulsed-bias etching operation.

5. The method of claim 4, wherein an etching source gas for the etching the substrate includes at least one hydrogen source gas and at least one fluorine source gas.

6. The method of claim 1, wherein the eliminating damage to the plurality fins recrystallizes damaged areas of the first and second plurality of fins.

7. A method for manufacturing a semiconductor device, the method comprising:
   etching a substrate to form a fin structure;
   annealing the fin structure; and
   after the annealing, forming one or more semiconductor layers over the fin structure,
   wherein the fin structure has a sidewall surface roughness Ra of greater than 0 nm and less than 1.8 nm, and
   a crystallinity of the fin structure is greater than 90% and less than 100%.

8. The method of claim 7, wherein the fin structure comprises a plurality of fins, and a depth variation of the plurality of fins is greater than 0% and less than 3%.

9. The method of claim 7, wherein:
   the etching the substrate comprises a plasma dry etching with a pulsed bias voltage, and
   the pulsed bias voltage comprises a frequency in a range from 200 Hz to 8000 Hz.

10. The method of claim 9, wherein a duty ratio of the pulsed bias voltage is in a range from 0.2 to 0.6.

11. The method of claim 9, wherein a voltage of the pulsed bias voltage is in a range from 100 V to 900 V.

12. The method of claim 9, wherein the plasma dry etching comprises a mixed gas of at least one hydrogen source, at least one fluorine source and at least one carrier gas.

13. The method of claim 7, further comprising, after the one or more semiconductor layers are formed:
   performing a patterning operation on the fin structure to divide the fin structure into pieces; and
   performing a second annealing operation.

14. A method for manufacturing a semiconductor device, the method comprising:
   etching a substrate to form a fin structure;
   annealing the fin structure; and
   after the annealing, forming one or more semiconductor layers over the fin structure,
   wherein a hydrogen content of the fin structure is in a range from $1\times10^{18}$ atoms/cm$^3$ to $3\times10^{18}$ atoms/cm$^3$.

15. The method of claim 14, wherein a crystallinity of the fin structure is greater than 90% and less than 100%.

16. The method of claim 14, wherein the fin structure comprises a plurality of fins, and a depth variation of the plurality of fins is greater than 0% and less than 3%.

17. The method of claim 14, wherein:
   the fin structure includes a lower layer made of Si and an upper layer made of SiGe.

18. The method of claim 14, further comprising, after the forming the one or more semiconductor layers forming an isolation insulating layer 30 such that an upper portion of the fin structure protrudes from the isolation insulating layer.

19. The method of claim 18, further comprising, after the forming the isolation insulating layer, forming a cap semiconductor layer over the fin structure.

20. The method of claim 14, wherein the etching comprises a mixed gas of at least one hydrogen source and at least one fluorine source.

* * * * *